United States Patent
Standaert et al.

(10) Patent No.: US 9,252,242 B2
(45) Date of Patent: Feb. 2, 2016

(54) SEMICONDUCTOR STRUCTURE WITH DEEP TRENCH THERMAL CONDUCTION

(71) Applicant: International Business Machines Corporation, Armonk, NY (US)

(72) Inventors: Theodorus Eduardus Standaert, Clifton Park, NY (US); Kangguo Cheng, Schenectady, NY (US); Junjun Li, Williston, VT (US); Balasubramanian Pranatharthi Haran, Watervliet, NY (US); Shom Ponoth, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 13/849,694

(22) Filed: Mar. 25, 2013

(65) Prior Publication Data
US 2014/0284717 A1    Sep. 25, 2014

(51) Int. Cl.
| | |
|---|---|
| *H01L 29/66* | (2006.01) |
| *H01L 29/861* | (2006.01) |
| *H01L 29/40* | (2006.01) |
| *H01L 29/423* | (2006.01) |
| *H01L 27/02* | (2006.01) |
| *H01L 23/367* | (2006.01) |
| *H01L 23/373* | (2006.01) |
| *H01L 29/06* | (2006.01) |
| *H01L 27/12* | (2006.01) |

(52) U.S. Cl.
CPC ........ *H01L 29/66795* (2013.01); *H01L 23/367* (2013.01); *H01L 23/3738* (2013.01); *H01L 27/0255* (2013.01); *H01L 27/1203* (2013.01); *H01L 29/0603* (2013.01); *H01L 29/402* (2013.01); *H01L 29/423* (2013.01); *H01L 29/42376* (2013.01); *H01L 29/6609* (2013.01); *H01L 29/66742* (2013.01); *H01L 29/861* (2013.01); *H01L 29/8613* (2013.01); *H01L 27/1211* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,589,823 | B1 | 7/2003 | Beebe et al. |
| 7,052,937 | B2 | 5/2006 | Clevenger et al. |
| 8,673,729 | B1 * | 3/2014 | Basker et al. ............... 438/388 |
| 2006/0202249 | A1 * | 9/2006 | Cheng et al. ................ 257/301 |
| 2011/0012196 | A1 * | 1/2011 | Williams et al. ............. 257/343 |

* cited by examiner

*Primary Examiner* — Whitney T Moore
*Assistant Examiner* — Scott R Wilson
(74) *Attorney, Agent, or Firm* — Steven J. Meyers; Matthew C. Zehrer; Howard M. Cohn

(57) ABSTRACT

Diodes and resistors for integrated circuits are provided. Deep trenches (DTs) are integrated into the diodes and resistors for the purposes of thermal conduction. The deep trenches facilitate conduction of heat from a semiconductor-on-insulator substrate to a bulk substrate. Semiconductor fins may be formed to align with the deep trenches.

5 Claims, 4 Drawing Sheets

US 9,252,242 B2

SEMICONDUCTOR STRUCTURE WITH DEEP TRENCH THERMAL CONDUCTION

FIELD OF THE INVENTION

The present invention relates generally to semiconductors, and more particularly, to semiconductor structures with deep trench thermal conduction and methods of fabrication.

BACKGROUND OF THE INVENTION

Diodes and resistors in an integrated circuit (IC) may be subjected to high voltages. For example, high voltages can develop in the vicinity of an integrated circuit due to the build-up of static charges. A high potential may be generated to an input or output buffer of the integrated circuit, which may be caused, for example, by a person touching a package pin that is in electrical contact with the input or output buffer. When the electrostatic charges are discharged, a high current is produced at the package nodes of the integrated circuit, and is referred to as electrostatic discharge (ESD).

Regardless of the source of the high voltage, it is desirable to have a diode or resistor in an IC that is more resilient to high voltages. Furthermore, as both planar and fin-based technologies are prone to damage from high voltage, it is desirable to have a solution applicable to both technologies.

SUMMARY OF THE INVENTION

In one embodiment, a semiconductor structure is provided. The semiconductor structure comprises a bulk semiconductor substrate, an insulator layer disposed on the bulk semiconductor substrate, a semiconductor-on-insulator layer disposed on the insulator layer, a plurality of deep trenches formed within the semiconductor structure, each deep trench of the plurality of deep trenches extending from semiconductor-on-insulator into the bulk semiconductor substrate, a first terminal region formed on a perimeter region of the semiconductor structure, a second terminal region formed on a central region of the semiconductor structure, wherein a first subset of the plurality of deep trenches is disposed within the first terminal region, and wherein a second subset of the plurality of deep trenches is disposed within the second terminal region.

In another embodiment, a semiconductor structure is provided. The semiconductor structure comprises a bulk semiconductor substrate, an insulator layer disposed on the bulk semiconductor substrate, a semiconductor-on-insulator layer disposed on the insulator layer, a plurality of deep trenches formed within the semiconductor structure, each deep trench of the plurality of deep trenches extending from the semiconductor-on-insulator layer into the bulk semiconductor substrate, a gate ring disposed on the semiconductor structure, a plurality of deep trenches disposed within the gate ring, a plurality of fins disposed within the gate ring and on the plurality of deep trenches, a first terminal region formed within the gate ring, and a second terminal region formed within the gate ring.

In another embodiment, a method of forming a semiconductor structure is provided. The method comprises depositing an insulator layer on a bulk semiconductor substrate, depositing a semiconductor-on-insulator layer on the insulator layer, forming a plurality of deep trenches in the semiconductor structure, and forming a gate ring on the semiconductor structure, the gate ring delineating a central region and a perimeter region, doping the central region with a first dopant type, and doping the perimeter region with a second dopant type.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
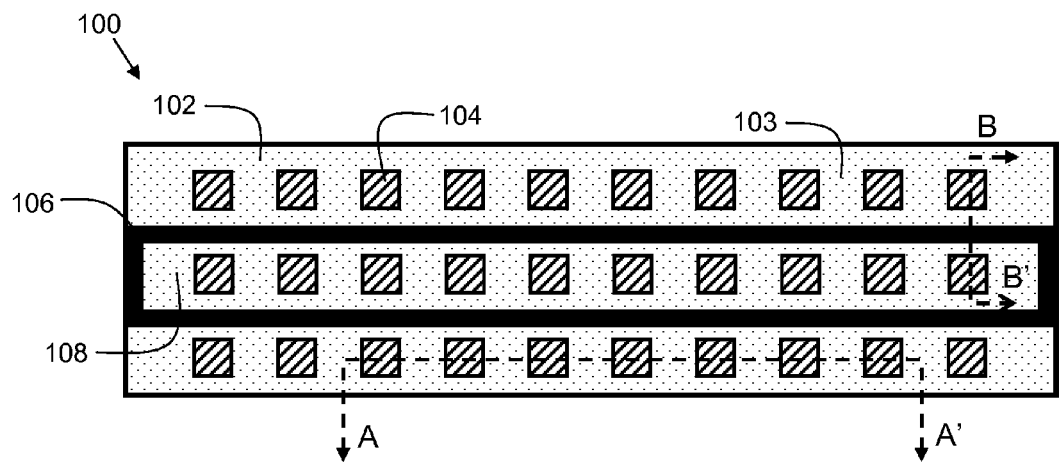

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a top-down view of a diode in accordance with embodiments of the present invention.

Figure 2:
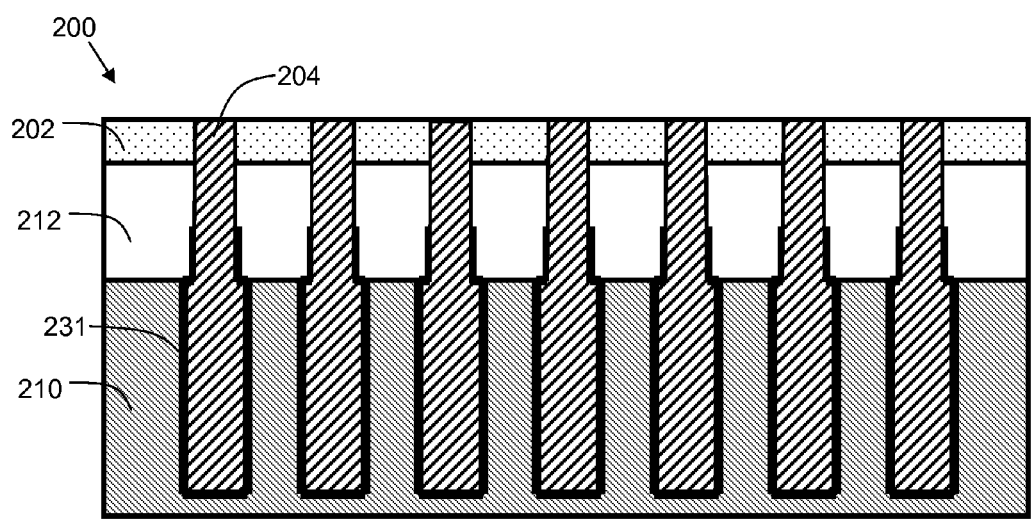

FIG. 2 is a side view of a diode as viewed along line A-A' of FIG. 1.

Figure 3:
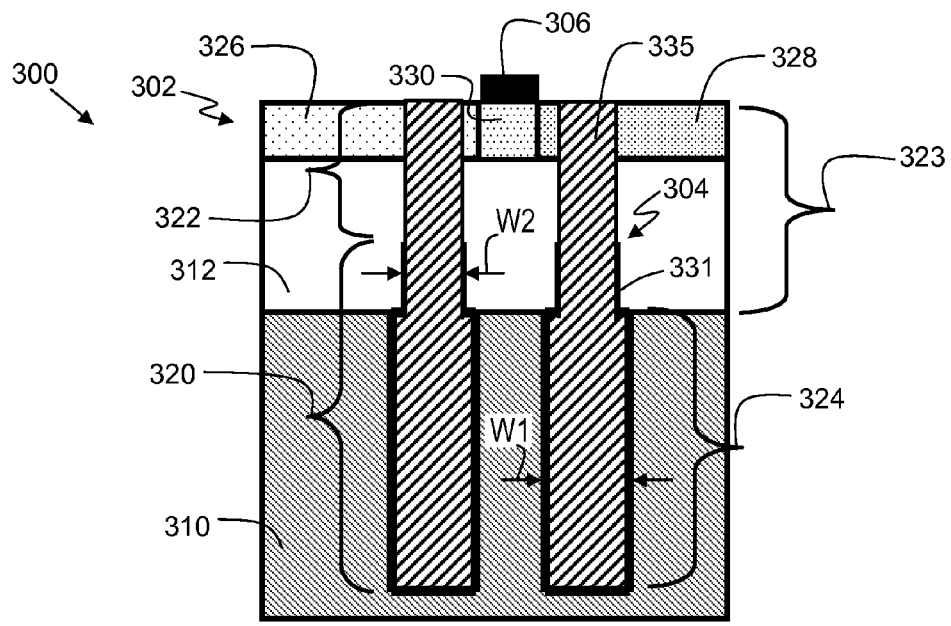

FIG. 3 is a side view of a diode as viewed along line B-B' of FIG. 1.

Figure 4:
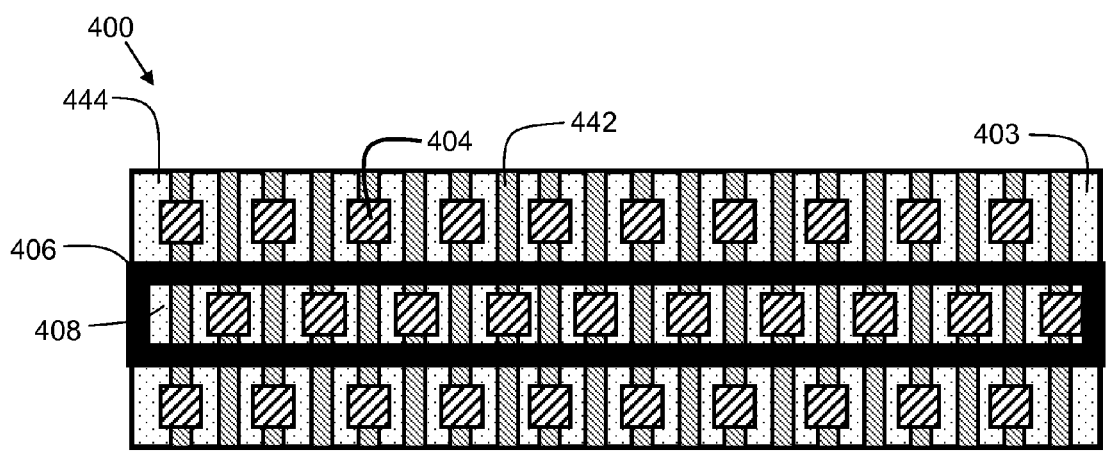

FIG. 4 is a top-down view of a fin diode in accordance with embodiments of the present invention.

Figure 5:
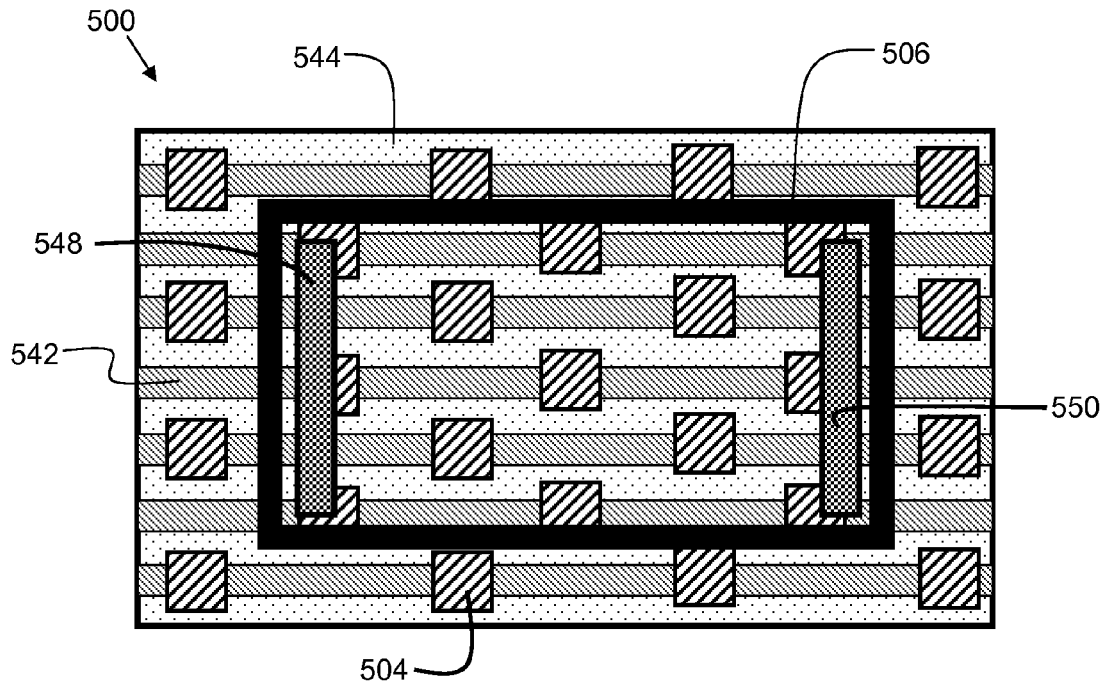

FIG. 5 is a top-down view of a fin resistor in accordance with embodiments of the present invention.

Figure 6:
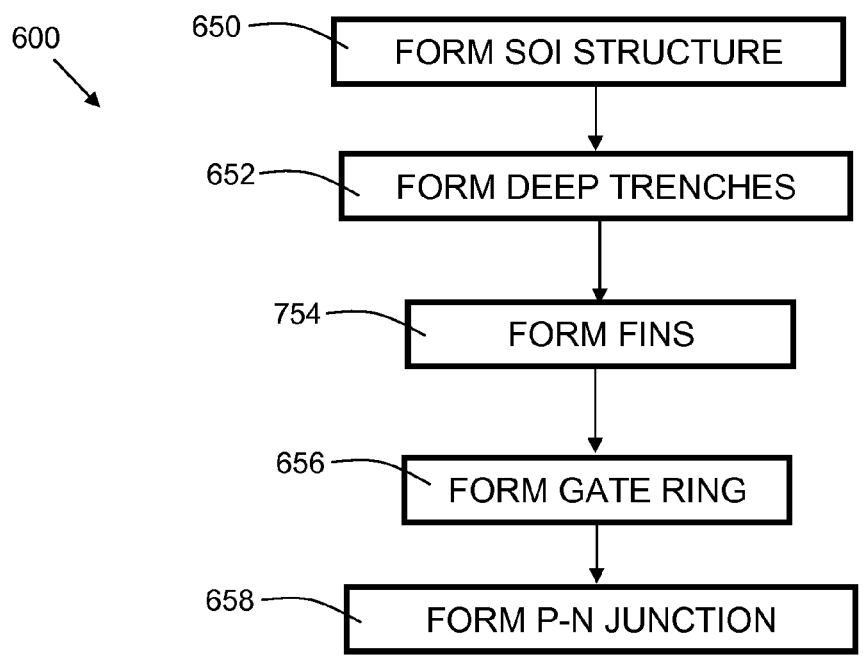

FIG. 6 is a flowchart indicating process steps for embodiments of the present invention.

Figure 7:
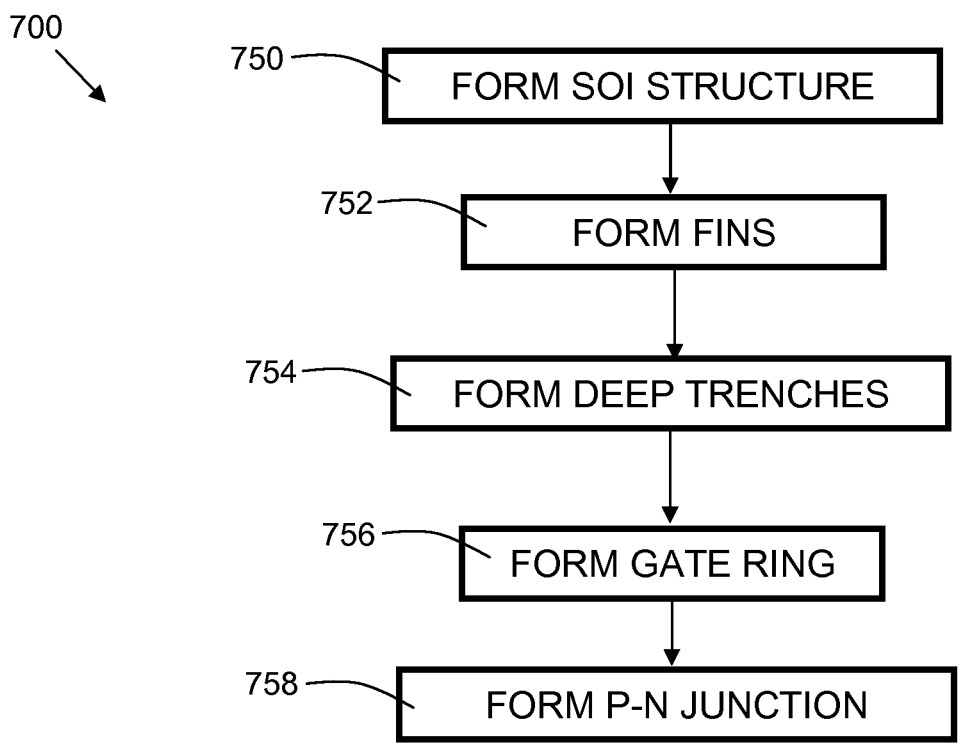

FIG. 7 is a flowchart indicating process steps for alternative embodiments of the present invention.

DETAILED DESCRIPTION

Embodiments of the present invention provide improved diodes and resistors for integrated circuits. Deep trenches (DTs) are integrated into the diodes and resistors for the purposes of thermal conduction. The deep trenches facilitate conduction of heat from a semiconductor-on-insulator substrate to a bulk substrate, making the devices more resilient to heat generated from applied voltages and currents.

FIG. 1 is a top-down view of a diode 100 in accordance with embodiments of the present invention. A semiconductor-on-insulator (SOI) structure is used to form the diode 100. As viewed top-down, semiconductor-on-insulator layer 102 is visible. Semiconductor-on-insulator layer 102 may be comprised of silicon. A plurality of deep trenches (DTs), shown generally as 104, is formed in the SOI structure. A deep trench is a trench with a depth greater than its width, and may be a so-called "high aspect ratio" trench. A gate ring 106 is disposed on the structure. Gate ring 106 may be comprised of polysilicon. The gate ring 106 may be formed via a sidewall image transfer (SIT) process. The gate ring 106 delineates a central region 108 inside the gate ring, from a perimeter region 103 which is outside of gate ring 106. The central region 108 is doped with a first dopant type (e.g. N-type), and the perimeter region 103 is doped with a second dopant type which is the opposite type (e.g. P-type). In some embodiments, the central region 108 may be doped P-type and the perimeter region 103 may be doped N-type. In embodiments, the P-type dopant species may be boron, and the N-type dopant species may be arsenic or phosphorous.

FIG. 2 is a side view of a diode 200 as viewed along line A-A' of FIG. 1. Bulk semiconductor substrate 210 forms the base of the structure. Bulk semiconductor substrate 210 may be comprised of any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Disposed above bulk semiconductor substrate 210 is insulator layer 212. Insulator layer 212 may be comprised of oxide, and may be referred to as a buried oxide (BOX) layer. Disposed on insulator layer 212 is semiconductor-on-insulator (SOI) layer 202. As stated previously, similar elements may be referred to by similar numbers in various figures (FIGs) of the drawing, in which case typically the last two significant digits may be the same. For example, semiconductor-on-insulator (SOI) layer 202 of FIG. 2 is similar to semiconductor-on-insulator (SOI) layer 102 of FIG. 1. A plurality of deep trenches, shown generally as 204, is formed within the diode 200. Each deep trench has a dielectric layer 231 disposed in a lower portion of the trench to provide electrical isolation between deep trench 204 and bulk semiconductor substrate 210.

FIG. 3 is a side view of a diode 300 as viewed along line B-B' of FIG. 1. Gate ring 306 delineates a P-N junction within SOI layer 302. Regions 326 and 328 are terminal regions for the diode. The terminal regions for the diode may be either a cathode or an anode. A first subset of the plurality of deep trenches 304 is disposed within the first terminal region 326 and a second subset of the plurality of deep trenches is disposed within the second terminal region 328. In embodiments, an N+ region 328 forms a cathode of the diode. The N+ region 328 is a heavily doped N+ region. In some embodiments, the N+ region 328 has a dopant concentration ranging from about 1E18 atoms per cubic centimeter to about 1E19 atoms per cubic centimeter. In embodiments, a P+ region 326 forms an anode of the diode. The P+ region 326 is a heavily doped P+ region. In some embodiments, the P+ region 326 has a dopant concentration ranging from about 1E18 atoms per cubic centimeter to about 1E19 atoms per cubic centimeter. The region 330 directly under the gate ring 306 may be an N− region, which is a lightly doped N-type region. In some embodiments, region 330 may have a dopant concentration ranging from about 5E17 atoms per cubic centimeter to about 9E17 atoms per cubic centimeter.

Two deep trenches, indicated generally as 304 are shown in this view. Each deep trench (DT) is filled with a conductor 335. In embodiments, conductor 335 may be comprised of polysilicon. Each DT comprises an upper region 323 which extends from SOI layer 302 through insulator layer 312, and lower region 324 which extends into bulk semiconductor substrate 310. The DTs have a depth that is greater than the width. In some embodiments, the DTs may be "bottle-shaped" where the lower region 324 has a first width W1 that is greater than a second width W2 for the upper region 323. The bottle shape may be formed by a variety of techniques known in the industry, such as selective isotropic etching. In some embodiments, the DTs may have corrugated sidewalls to increase the surface area of the conductor 335 against the bulk substrate 310. The interior surface of the DTs comprise an insulated region 320 that is lined with a dielectric layer 331. Dielectric layer 331 may be a high-K (k>4) dielectric layer. In some embodiments, dielectric layer 331 is comprised of hafnium oxide. In other embodiments, dielectric layer 331 may be comprised of lanthanum oxide. Other materials for dielectric layer 331 are possible. The dielectric layer 331 may be deposited via atomic layer deposition (ALD), or other suitable method. In some embodiments, the dielectric layer 331 may have a thickness ranging from about 5 angstroms to about 20 angstroms. The dielectric layer 331 extends from an intermediate point within the insulator layer 312, and extending to the bottom of each deep trench within bulk semiconductor substrate 310, and serves to electrically isolate the diode from the bulk semiconductor substrate 310. The DTs serve to transfer heat away from the P-N junction of the diode and into the bulk substrate, enabling the diode to accept more heat, and hence, higher currents and voltages. The DTs have an upper portion 322 where the dielectric layer 331 is not present, and where the trench conductor 335 is in direct physical contact with the SOI layer 302. While preferred embodiments utilize a gate ring such as gate ring 306, it is also possible to use embodiments of the present invention without a gate ring. For example, gate stripes may be stretched across the silicon and used form the anode and cathode of the diode.

FIG. 4 is a top-down view of a fin diode 400 in accordance with embodiments of the present invention. In this embodiment, a plurality of fin structures 442 are formed on the SOI layer, and are disposed over deep trenches 404. A merging semiconductor region 444 may be used to merge the fins. The merging semiconductor region 444 may be comprised of an epitaxially grown semiconductor such as epitaxially grown silicon or silicon germanium. The gate ring 406 delineates a central region 408 inside the gate ring, from a perimeter region 403 which is outside of gate ring 406. In embodiments, a first epitaxial semiconductor region is in direct physical contact with the fins in the central region 408 and a second epitaxial semiconductor region is in direct physical contact with the fins in the perimeter region 403. The central region 408 is doped with one dopant type (e.g. N-type), and the perimeter region 403 is doped with the opposite type (e.g. P-type). In some embodiments, the central region 408 may be doped P-type and the perimeter region 403 may be doped N-type. In embodiments, the P-type dopant species may be boron, and the N-type dopant species may be arsenic or phosphorous.

FIG. 5 is a top-down view of a fin resistor 500 in accordance with embodiments of the present invention. Similar to fin diode 400 of FIG. 4, fin resistor 500 comprises a plurality of deep trenches 504 formed in a semiconductor structure comprising a SOI layer, an insulator layer, and a bulk semiconductor substrate. A gate ring 506 is disposed on the semiconductor structure. Unlike a diode, fin resistor 500 comprises a first contact 548 and a second contact 550 that are both within the gate ring 506. The contacts 548 and 550 may be comprised of polysilicon, or other suitable conductor. The deep trenches 504 are formed with a similar structure to that shown in FIGS. 2 and 3, such that the deep trenches are electrically isolated from the bulk semiconductor substrate. The resistance value of fin resistor 500 may be controlled by parameters such as dopant concentrations and/or length of the device. The deep trenches serve to transfer excess heat to the bulk semiconductor substrate, thereby increasing the resilience of the fin resistor to elevated currents.

FIG. 6 is a flowchart 600 indicating process steps for embodiments of the present invention. In process step 650, a semiconductor-on-insulator (SOI) structure is formed, which comprises an insulator layer (e.g. BOX layer) disposed on a bulk semiconductor substrate, and a semiconductor-on-insulator layer disposed on the insulator layer. The semiconductor-on-insulator layer is much thinner than the bulk semiconductor substrate. In process step 652, deep trenches are formed. This comprises recessing through the silicon-on-insulator layer and insulator layer and into the bulk substrate. A dielectric layer is formed on the interior surface of the deep trench, and may then be partially removed in the upper portion of the deep trench (see 322 of FIG. 3). A conductor, such as polysilicon (see 335 of FIG. 3) is then deposited in the deep trench. In process step 654, fins are formed in the semiconductor-on-insulator layer. These fins may be formed using techniques known in the industry, such as patterning and recessing. In process step 656, a gate ring is formed (see 406 of FIG. 4). The gate ring may be comprised of polysilicon, and may be formed via a sidewall image transfer (SIT) process. In process step 658, a P-N junction is formed by doping the central region (within the gate ring) with one dopant type (N-type or P-type), and doping the perimeter region (outside the gate ring) with the opposite dopant type.

FIG. 7 is a flowchart 700 indicating process steps for alternative embodiments of the present invention. In this embodiment, the deep trenches are formed after the fins (DT-last), whereas in the embodiment described in FIG. 6, the deep trenches are formed prior to formation of the fins (DT-first). In process step 750, a semiconductor-on-insulator (SOI) structure is formed, which comprises an insulator layer (e.g. BOX layer) disposed on a bulk semiconductor substrate, and a semiconductor-on-insulator layer disposed on the insulator layer. The semiconductor-on-insulator layer is much thinner than the bulk semiconductor substrate. In process step 752, fins are formed in the semiconductor-on-insulator layer. These fins may be formed using techniques known in the industry, such as patterning and recessing. In process step 754, deep trenches are formed. This comprises recessing through the fin and insulator layer and into the bulk substrate. A dielectric layer is formed on the interior surface of the deep trench, and may then be partially removed in the upper portion of the deep trench (see 322 of FIG. 3). A conductor, such as polysilicon (see 335 of FIG. 3) is then deposited in the deep trench. In process step 756, a gate ring is formed (see 406 of FIG. 4). The gate ring may be comprised of polysilicon, and may be formed via a sidewall image transfer (SIT) process. In process step 758, a P-N junction is formed by doping the central region (within the gate ring) with one dopant type (N-type or P-type), and doping the perimeter region (outside the gate ring) with the opposite dopant type.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor structure comprising:
a bulk semiconductor substrate;
an insulator layer disposed on the bulk semiconductor substrate;
a semiconductor-on-insulator layer disposed on the insulator layer;
a plurality of deep trenches formed within the semiconductor structure, each deep trench of the plurality of deep trenches extending from the semiconductor-on-insulator layer into the bulk semiconductor substrate, and wherein each deep trench is filled with polysilicon;
a gate ring disposed on the semiconductor structure, wherein a portion of the plurality of deep trenches is disposed within the gate ring;
a plurality of fins disposed within the gate ring and on the plurality of deep trenches;
a first contact, formed within the gate ring, disposed over and overlapping a first subset of the portion of the plurality of deep trenches disposed within the gate ring; and
a second contact, formed within the gate ring, disposed over and overlapping a second subset of the portion of the plurality of deep trenches disposed within the gate ring, wherein the first subset of the plurality of deep trenches comprises at least two deep trenches, and wherein the second subset of the plurality of deep trenches comprises at least two deep trenches.

2. The semiconductor structure of claim 1, further comprising a dielectric layer disposed on an interior surface of a lower portion of the deep trench, wherein the lower portion ranges from an intermediate point within the insulator layer and extending to the bottom of the deep trench.

3. The semiconductor structure of claim 2, wherein the dielectric layer disposed on an interior surface of a lower portion of each deep trench comprises hafnium oxide.

4. The semiconductor structure of claim 1, wherein each deep trench is bottle-shaped.

5. The semiconductor structure of claim 1, wherein the first contact and second contact are comprised of polysilicon.

* * * * *